United States Patent [19]

Iwai et al.

[11] Patent Number: 4,575,466
[45] Date of Patent: Mar. 11, 1986

[54] TREATMENT PROCESS FOR SEMICONDUCTOR WAFER

[75] Inventors: Hiroshi Iwai, Tokyo; Hideo Ohtsuka, Chigasaki, both of Japan

[73] Assignee: Tokyo Shibaura Denki Kabushiki Kaisha, Kawasaki, Japan

[21] Appl. No.: 566,397

[22] Filed: Dec. 28, 1983

[30] Foreign Application Priority Data

Dec. 28, 1982 [JP] Japan ................. 57/233520

[51] Int. Cl.⁴ .......................................... B05D 3/02
[52] U.S. Cl. ........................... 427/53.1; 148/191; 250/492.2
[58] Field of Search .......... 427/53.1, 42, 35; 219/121 L, 121 LM, 121 EB; 250/492.2, 492.3; 148/191, 187

[56] References Cited

U.S. PATENT DOCUMENTS

| | | |
|---|---|---|
| 4,220,483 | 9/1980 | Cazcarra .................. 148/1.5 |
| 4,249,962 | 2/1981 | Cellar . |
| 4,257,827 | 3/1981 | Schwuttke et al. . |
| 4,437,922 | 3/1984 | Bischoff et al. .................. 148/187 |

OTHER PUBLICATIONS

"Ion-Beam Gettering", by Heiner Ryssel, pp. 233-237.
"Intrinsic Gettering by Oxide Precipitate Induced Dislocations in Czochralski Si", by T. Y. Tan, E. E. Gardner, and W. K. Tice.

*Primary Examiner*—John H. Newsome
*Attorney, Agent, or Firm*—Oblon, Fisher, Spivak, McClelland & Maier

[57] ABSTRACT

A process for preparing a semiconductor wafer having one region including impurities at a concentration of more than $5 \times 10^{16}$ cm$^{-3}$ therein, in which an energy beam is radiated onto this one region of the semiconductor wafer in order to form small defects therein and out diffuse the impurities, respectively. Thereby, a region including no small defects is formed in a surface region of the semiconductor wafer and another region including many defects is formed in an internal region of the semiconductor wafer.

11 Claims, 12 Drawing Figures

TREATMENT PROCESS FOR SEMICONDUCTOR WAFER

BACKGROUND OF THE INVENTION

1. Field of the Invention

This invention relates to a treatment process for an intrinsic gettering semiconductor wafer.

2. Description of the Prior Art

Nowadays, intrinsic gettering wafers (IG wafer), are often used for high density integrated circuit devices. An IG wafer has the structure as shown in FIG. 1. In this structure, one region (2) which includes no small crystal defects is formed in the surface of the wafer (1) and another region (3) which includes many small defects is formed in the interior of the wafer. By small defects is meant all defects, including combinations like $SiO_2$, dislocations, stacking faults in the crystal, etc. When a semiconductor device is manufactured using an IG wafer, impurities (4) in the surface region (2) are gettered to the internal region (3) in a heating step and undesirable carriers (5) produced in the surface region (2) recombine in the internal region (3) as shown in FIG. 2.

FIG. 2 shows a completed memory device. A thick $SiO_2$ field layer (6) is formed on a P type semiconductor substrate (1) of an IG wafer made of Si. An electrode (7) made of polycrystalline Si is formed on a thin $SiO_2$ layer (8) and the thick field layer (6). A capacitance is constituted between the electrode (7) and the substrate (1). A transfer gate electrode (9) made of polycrystalline Si is formed on a gate insulation layer (10) made of $SiO_2$ and an insulation layer (11) made of $SiO_2$. By applying a voltage to the transfer gate electrode (9), an inversion layer is induced in the surface region under the gate insulation layer (11). Wiring layers (13) are connected to the transfer gate electrode (9), the electrode (7) and a N+ layer (14) formed in the surface region (2) through holes formed in the insulation layer (12). In this device, the undesirable carriers (5) often will be produced in an operating srate, and may become the cause of misoperation of the device. The undesirable carriers (5) are produced by α-rays incident from the outside, by a breakdown in the PN-junction and so on. But if an IG wafer is used, the undesirable carriers (5) recombine in the internal region (3).

In a prior fabrication technique, an IG wafer is manufactured as follows. At first, a semiconductor wafer (15) made of Si including oxygen is prepared as shown in FIG. 3. Oxygen in a concentration of $10^{18}$ cm$^{-3}$ is included in the wafer (15). Small defects will be formed positively by the oxygen in the following steps. The wafer (15) is heated in an oxidation atmosphere of about 800° C. for about 2 to 5 hours. Then, the supersaturated oxygen in the wafer (15) diffuses and cores (16) of small defects are produced as shown in FIG. 4. Next, this wafer (15) is heated again in an oxidation atmosphere of about 1100° C. for abour 4 hours. Then, oxygen and small defects (16) in the surface region of the wafer (15) are out diffused because of the high temperature. A region (17) including no small defects is formed in the surface of the wafer (15), and another region (18) including many small defects is formed in the interior of the wafer (15) as shown in FIG. 5. The region (17) is generally deeper than 5 μm because of the high temperature and long heating process. In an experiment, region (17) was formed 20 μm deep in the case of a wafer having a thickness of 600 μm. It is difficult to control precisely the depth of the region (17) because of the long heating treatment. A depth of 20 μm is too deep for application of the device as a memory device, for high density inregrated circuits and so on, because the active region of these devices is generally much thinner than 5 μm. Also, the wafer (15) may sometimes bend because of the long high temperature treatment and the thick defect-region (18) having a thermal expansion coefficient different from that of the region (17). Bending of the wafer (15) will produce other undesirable small defects in the surface region (17). Additionally, impurities such as Fe, Cu, Ag and so on may be introduced in the wafer (15) during the high temperature treatment. As the long heating treatment is performed in an oxidation atmosphere in order to prevent contamination, an insulation layer of $SiO_2$ is formed on the surface of the wafer (15). The insulation layer may cause additional stacking faults to be produced in the surface region (17) of the wafer (15). These defects, namely impurities and stacking faults in the surface region (17) are harmful for the intended operation of the device, and the device will not operate with the predetermined function. Furthermore, manufacturing becomes more expensive because of the requirement of the high temperature and long heating treatment.

There is known another process in which at first a low temperature treatment is performed followed by a high temperarure treatment. But, this process also requires a long time.

SUMMARY OF THE INVENTION

It is accordingly an object of this invention to provide an improved treatment process for semiconductor wafers suitable for integrated circuit devices.

Another object of this invention to provide a semiconductor wafer which has a thin surface region less than or equal to 5 μm and having no small defects, and an internal region including many small defects.

Another object of this invention to provide a treatment process for a semiconductor wafer, which prevents or minimizes bending of the wafer.

These and other objects are achieved according to this invention by providing a treatment process for semiconductor wafers including the steps of preparing a semiconductor body having one region including impurities of a concentration of more than $5 \times 10^{16}$ cm$^{-3}$ therein, radiating an energy beam onto at least one portion of the one region, and forming a first region including no small defects in a surface region of the one portion and a second region including many defects in an internal region of the one portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
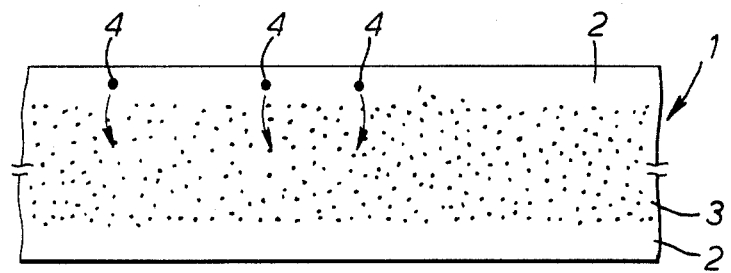
FIG. 1 is a cross-sectional view of a prior art semiconductor IG wafer.
Figure 2:
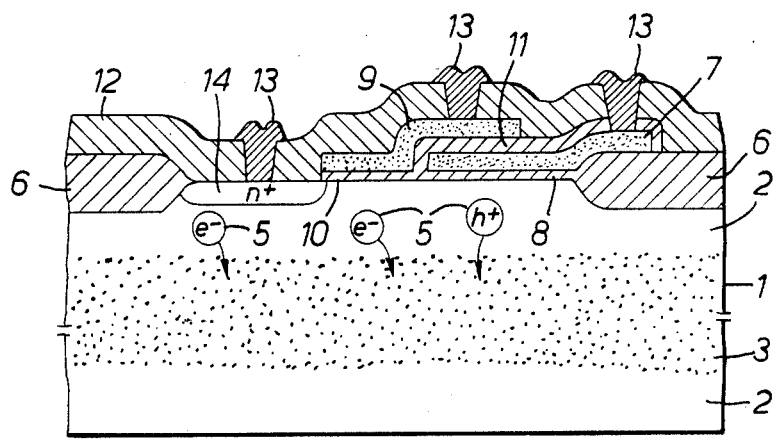
FIG. 2 is a cross-sectional view of a completed conventional semiconductor device using the IG wafer as a substrate.
Figure 3:
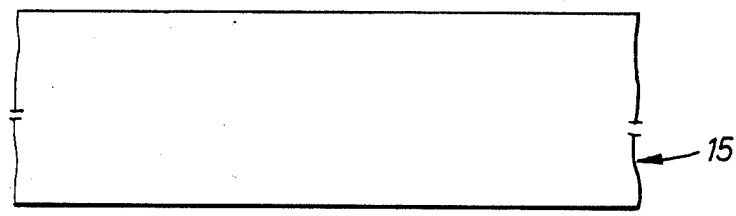
FIGS. 3 to 5 are cross-sectional views of the IG wafer in each step of fabrication in a conventional process.
Figure 4:
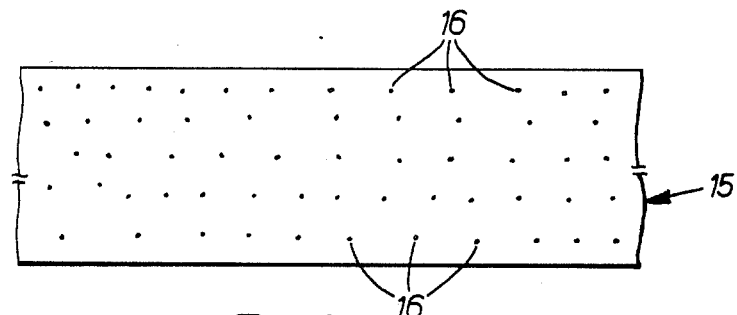
Figure 5:
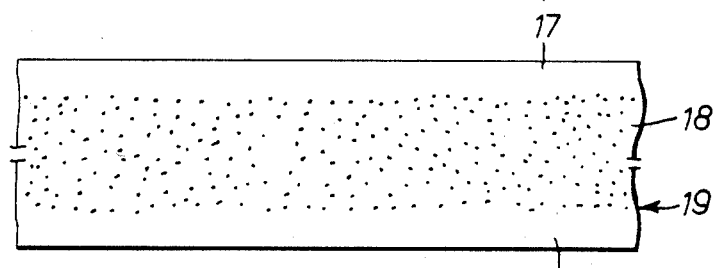
Figure 6:
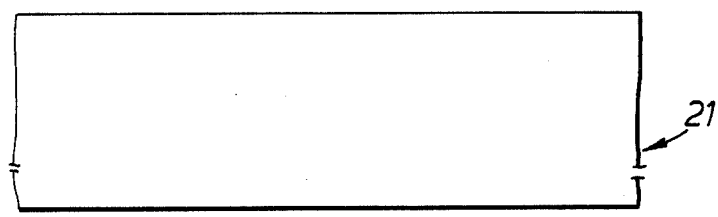
FIGS. 6 to 8 are cross-sectional views of the IG wafer in each treatment step of the process according to this invention.
Figure 7:
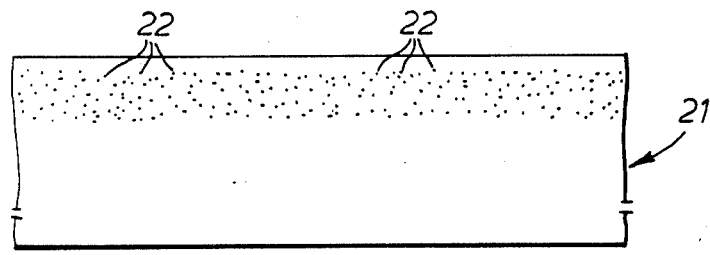
Figure 8:
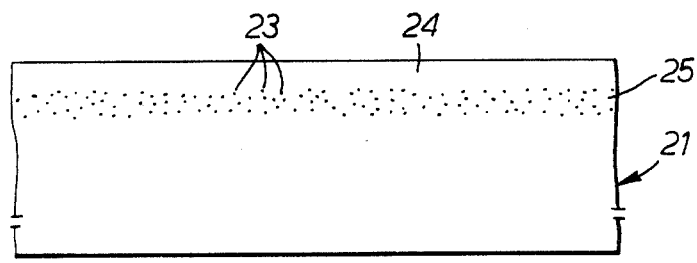

Referring now to the drawings, wherein like reference numerals designate identical or corresponding parts throughout the several views, and more particularly to FIGS. 6 to 8 thereof, one embodiment of this invention is explained.

At first, a single crysralline silicon wafer (21) is prepared as shown in FIG. 6. This wafer (21) includes oxygen in a concentration of $1 \times 10^{18}$ cm$^{-3}$ as impurities. Next, a YAG laser beam is radiated onto the wafer (21) and scans the wafer surface. The laser beam has a wavelength of about 1.06 μm and a power of more than 0.1 mJ/pulse. The laser beam is radiated at a diameter of about 100 μm and for about 10~60 minutes. The supersaturated oxygen in the surface region of the wafer (21) diffuses and begins to join the single crystal combinations or crystals when the temperature in the surface region increases due to the laser beam radiation. Many cores (22) of small defects are thereby formed in the surface region of the wafer (21) as shown in FIG. 7. The cores (22) have a density of about $10^6$ cm$^{-3}$. These cores 22 constitute a transition state to complete small defects, and will grow to complete small defects in a following heating step. The oxygen in the very thin surface region is out-diffused by the heat, therefore no cores are formed in this region. If an integrated circuit is manufactured by using the wafer shown in FIG. 7, many defects (23) centering around the cores as shown in FIG. 8 are formed during a heating step of, for example about 900° C. for about 10~20 hours, in the course of the manufacturing process. The defects (23) are formed only in the internal region (25) of the wafer (21), and no defects are formed in the very thin surface region (24) because there was no cores (22).

As described above, the heating step to form the cores (22) is performed by using a laser beam in this first embodiment. The laser beam radiation allows a short heating treatment with the additional advantage that bending of the wafer (21) is decreased, which would be the cause of other undesirable defects. The laser treatment permits that only the surface region of the wafer (21) is heated therefore the out-diffusion of the supersaturated oxygen from the surface region (24) can be easily controlled. According to the described process of the invention, the surface region (24) including no small defects can be formed with a depth equal to or less than 5 μm. As the surface region (24) can be very thin, undesirable carriers, which will be produced by α-rays, by a breakdown in P-N junction, by leakage of light in a CCD and so on, can recombine immediately in the internal region (25) having many small defects. Therefore, the influence of the undesirable carriers on the device can be suppressed remarkably. Further, as the laser heating step need not be performed in a furnace, the wafer will not be contaminated by any impurities which otherwise would diffuse from the wall of a furnace as is evident in the conventional process. Furthermore, no insulation layer will be formed on the surface of the wafer because the heating step is performed in a short time. So, the stacking faults in the surface region, which would otherwise be produced by the insulation layer, are prevented.

In the above embodiment, the growth of the small defects (23) occurs during a heating step of a manufacturing process in which the wafer is used as the substrate and is further processed into a semiconductor device. However, it is also possible to add a heating step, at a temperature equal to or less than 900° C., after the laser beam radiating step and more or less independent of the following manufacturing process if the heating step of that process is insufficient to cause the small defects to grow. The growth of the defects (23) can be also performed by means of a second laser beam radiation step instead of an ordinary heating process. In this case, the cores (22) in the upper parts of the region (25) may disappear, and the region (24) having no defects may extend a little, and the growth and the formation of the cores (22) will be observed in the deeper region. Generally, the first laser beam step is performed at lower power radiation and the second laser is performed at high power radiation. But, these steps can be reversed.

Figure 9:
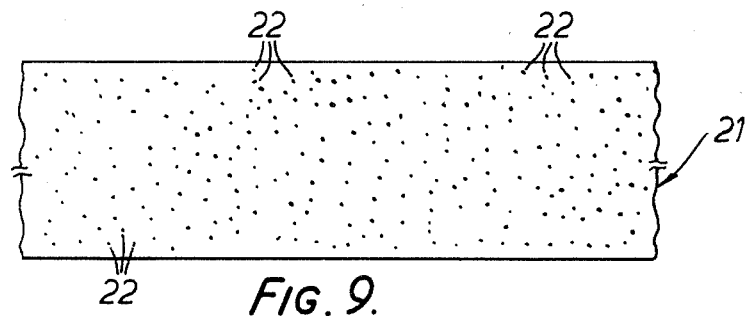
FIGS. 9 and 10 are cross-sectional views of the IG wafer in each treatment step of another embodiment of the process according to this invention.
Figure 10:
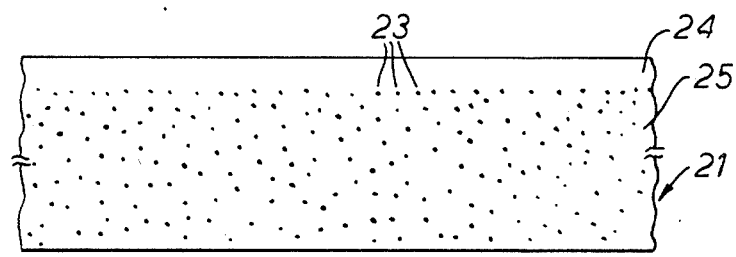

Next, another embodiment of this invention is shown in FIGS. 9 and 10. At first, a single crystalline silicon wafer (21) is prepared. The wafer (21) includes oxygen at a concentration of $10^{18}$ cm$-3$ The wafer (21) is heated in an oxidation atmosphere of 800° C. for 5 hours. Then, cores (22) are formed in the entire wafer with the diffusion of the supersaturated oxygen as shown in FIG. 9. Next, a YAG laser beam is scanned to radiate onto the surface of the wafer (21). The YAG laser beam has a wavelength of 1.06 μm and a power rating of more than 0.1 mJ/pulse. The laser beam is radiated at a diameter of 100 μm for about 10-60 minutes. Then, the cores (22) in the surface region disappear with the annealing out thereof and at the same time small defects (23) are accumulated in the deeper internal region of the wafer (21). Consequently, a region (24) having no defects is formed in the surface region of the wafer (21) onto which the laser beam is radiated, and a region (25) having many small defects (23) is formed in the deeper region thereof.

In this embodiment, the time duration of the first heating step is longer than the first embodiment, but the wafer (21) will bend less than that obtained by the prior process because even in this case the process is performed in a short time compared to the prior art.

The first heating step is performed in an oxidation atmosphere of about 800° C. in the second embodiment, and after that the laser beam is radiated onto the wafer. But the laser beam can be radiated after the wafer (21) was heated in the oxidation atmosphere of about 1050° C. to 1200° C. for about 2~5 hours and the oxygen in the surface region was out-diffused. Then the laser beam will have a power rating of about 0.01 to 0.3 mJ/pulse, a diameter of 100 μm and a radiation time of 2~3 hours.

These steps can be reversed. Namely, after the YAG laser beam having a power rating of 0.01 to 0.3 mJ/pulse (beam diameter of about 100 μm and radiation time 2-3 hours) is radiated on the surface of the wafer (21) and small defects are formed in the surface region with the diffusion of the supersaturated oxygen, the wafer (21) is heated in an oxidation atmosphere of about 1050° C. to 1200° C. for about 2~5 hours, and small defects in the surface region are annealed out and small defects are accumulated in the internal region.

Figure 11:
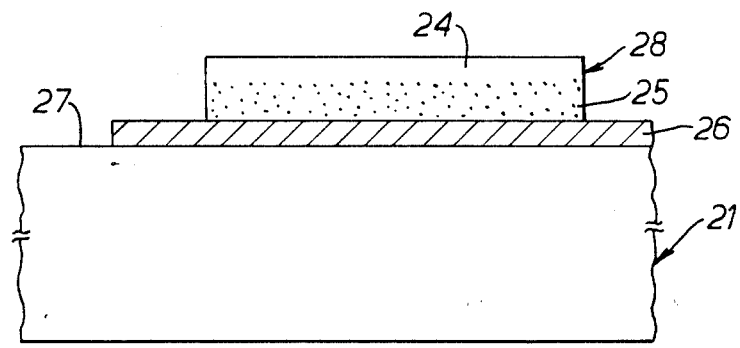
FIG. 11 is a cross-sectional view of an IG wafer treated using a further embodiment of the process according to this invention.

Another embodiment of the invention is shown in FIG. 11. At first, an oxidation layer (26) is formed on an intirnsic silicon semiconductor substrate (21). A hole (27) is then formed in the oxidation layer (26). Next, a single crystalline silicon layer is grown on the entire surface from the seed crystal of the exposed substrate (21). Then a single crystalline silicon layer (28) is formed through a patterning process. The silicon layer (28) has an oxygen concenrration of $1 \times 10^{18}$ cm$^{-3}$. Next, as shown in FIG. 11, a region (24) having no small defects is formed in the surface region of the silicon layer (28) after the same treatment as in the first embodiment. A silicon layer on an insulation layer is used in this embodiment, but it is applicable also for the single crystalline layer grown on a silicon semiconductor wafer and a SOS (silicon on Saphire) wafer.

Figure 12:
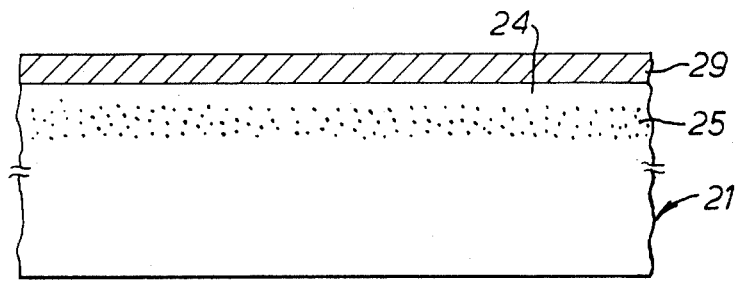
FIG. 12 is a cross-sectional view of an IG wafer treated using still another embodiment of tne process according to this invention.

Another embodiment is shown in FIG. 12. At first, an oxidation layer (29) is formed on the surface of a silicon wafer (21). Next, a region (24) having no small defects is formed in the surface region of the wafer (21) and a region (25) having many defects is formed in the internal region of the wafer (21) after the same treatment as the first embodiment.

A silicon wafer including oxygen is used in all of the above-mentioned embodiments. But, a silicon wafer including carbon or nitrogen instead of oxygen can be used similarly in this invention. Then the silicon wafer will have a carbon concentration of more than about $5 \times 10^{16}$ cm$^{-3}$. Also, another energy beam, for example a $CO_2$ laser beam, or another laser beam, electron beam and so on, can be used instead of the YAG laser beam used in the above embodiments.

The conditions of the heating treatment are determined by the power of the laser beam in the above embodiments. But these can be determined by the control of the spot diameter of the laser beam and the radiating time. After the heating treatment of the above embodiments, the wafer can be heated still more in an atmosphere of $N_2$ at 700° C. for about five hours in order to increase the size and the density of the small defects in the internal region having many small defects.

Furthermore, the heating treatment by the various beams can be performed between the manufacturing steps of the device, for example after the field $SiO_2$ is formed, in order to avoid various contaminations. The energy beam can be radiated only onto a specific portion, for example, the portion above which afterwards a $SiO_2$ field layer, a memory cell, a specific element and so on will be formed, i.e., a portion in which a region including no small defects is required.

It is preferable that the concentration of the impurities such as oxygen, carbon and nitrogen be $5 \times 10^{17}$ to $1.5 \times 10^{18}$ cm$^{-3}$, but it must be more than $5 \times 10^{16}$ cm$^{-3}$ because the cores cannot be formed fully if the concentration is less than $5 \times 10^{16}$ cm$^{-3}$.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A treatment process for a semiconductor wafer, comprising:
    preparing a semiconductor body having one region including impurities at a concentration more than $5 \times 10^{16}$ cm$^{-3}$ therein;
    at least a first radiating step including radiating an energy beam on at least one portion of the one region; and
    forming a first region including no small defects in a surface region of the one portion and a second region including many defects in an internal region of the one portion.

2. A treatment process for a semiconductor wafer according to claim 1, wherein the impurities are selected from the group consisting of oxygen, carbon and nitrogen.

3. A treatment process for a semiconductor wafer according to claim 1, wherein the semiconductor body comprises:
    single crystalline silicon.

4. A treatment process for a semiconductor wafer according to claim 1, comprising:
    forming said semiconductor body on an insulating substrate.

5. A treatment process for a semiconductor wafer according to claim 1, wherein the radiating step comprises radiating a laser beam.

6. A treatment process for a semiconductor wafer according to claim 1, wherein the radiating step comprises radiating an electron beam.

7. A treatment process for a semiconductor wafer according to claim 1, further comprising:
    a second radiating step including radiating an energy beam having different power levels than the radiation beam used in said first radiating step.

8. A treatment process for a semiconductor wafer according to claim 1, wherein a heating step is performed in a furnace before the radiating step.

9. A treatment process for a semiconductor wafer according to claim 1, wherein a heating step is performed after the radiating step.

10. A treatment process for a semiconductor wafer according to claim 1, further comprising:
    controlling the size and density of the defects by heating the semiconductor wafer after forming the first and second regions.

11. A treatment process for a semiconductor wafer according to claim 1, wherein the impurities have a concentration between $5 \times 10^{17}$ and $1.5 \times 10^{18}$ cm$^{-3}$.

* * * * *